United States Patent
Shiokawa

(10) Patent No.: US 10,770,214 B2
(45) Date of Patent: Sep. 8, 2020

(54) SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/292,840

(22) Filed: Mar. 5, 2019

(65) Prior Publication Data
US 2019/0287706 A1    Sep. 19, 2019

(30) Foreign Application Priority Data
Mar. 16, 2018  (JP) ................... 2018-049767

(51) Int. Cl.
*H01F 10/32* (2006.01)
*G11C 11/16* (2006.01)
(Continued)

(52) U.S. Cl.
CPC .......... *H01F 10/329* (2013.01); *G11C 11/161* (2013.01); *H01F 10/3254* (2013.01); *H01L 27/224* (2013.01); *H01L 43/02* (2013.01); *H01L 43/06* (2013.01); *H01L 43/1233* (2013.01); *H01L 43/1253* (2013.01); *H01L 43/143* (2013.01); *H01L 43/144* (2013.01); *G11C 11/1673* (2013.01); *G11C 11/1675* (2013.01); *H01L 43/146* (2013.01); *H01L 43/147* (2013.01)

(58) Field of Classification Search
CPC ....... H01F 10/329; H01L 43/04; H01L 43/06; H01L 43/08; G11C 11/14–16; G11C 11/161
See application file for complete search history.

(56) References Cited

U.S. PATENT DOCUMENTS 8,350,347 B2   1/2013  Gaudin et al.
8,829,590 B2   9/2014  Park
(Continued)

FOREIGN PATENT DOCUMENTS

WO   2008/123023 A1   10/2008
WO   2016/021468 A1   2/2016

OTHER PUBLICATIONS

Kato, Y.K. et al. "Observation of the Spin Hall Effect in Semiconductors". Science, vol. 306, pp. 1910-1913, 2004.
(Continued)

*Primary Examiner* — Allison Bernstein
(74) *Attorney, Agent, or Firm* — Oliff PLC

(57) ABSTRACT

A spin-orbit-torque magnetization rotational element includes: a spin-orbit-torque wiring extending in a first direction; a first ferromagnetic layer laminated on one surface of the spin-orbit-torque wiring; and a first electrode and a second electrode connected to the spin-orbit-torque wiring at positions sandwiching the first ferromagnetic layer in a plan view, wherein at least one of the first electrode and the second electrode includes therein a switching layer configured to shift between a high resistance state and a low resistance state with a predetermined threshold voltage as a boundary to allow an electric current to flow bidirectionally.

8 Claims, 3 Drawing Sheets

(51) Int. Cl.
*H01L 43/02* (2006.01)
*H01L 27/22* (2006.01)
*H01L 45/00* (2006.01)

(56) References Cited

U.S. PATENT DOCUMENTS

| | | |
|---|---|---|
| 9,741,764 B1 | 8/2017 | Terai et al. |
| 2010/0097063 A1 | 4/2010 | Ando et al. |
| 2015/0348606 A1 | 12/2015 | Buhrman et al. |
| 2017/0222135 A1 | 8/2017 | Fukami et al. |
| 2019/0288031 A1* | 9/2019 | Satoh ................ G11C 11/1675 |

OTHER PUBLICATIONS

Miron, M. Ioan et al. "Perpendicular switching of a single ferromagnetic layer induced by in-plane current injection". Nature, vol. 476, pp. 189-193, 2011.

Liu, Luqiao et al. "Spin torque switching with the giant spin Hall effect of tantalum". Science, vol. 336, pp. 1-12, 2012.

Liu, Luqia et al. "Current-Induced Switching of Perpendicularly Magnetized Magnetic Layers Using Spin Torque from the Spin Hall Effect". Physical Review Letters, vol. 109, pp. 096602, 2012.

Lee, KS. et al. "Threshold current for switching of a perpendicular magnetic layer induced by spin Hall effect". Applied Physics Letters, vol. 102, pp. 112410, 2013.

Lee, KS. et al. "Thermally activated switching of perpendicular magnet by spin-orbit spin torque". Applied Physics Letters, vol. 104, pp. 072413, 2014.

Fukami, Shunsuke et al. "Magnetization switching by spin-orbit torque in an antiferromagnet-ferromagnet bilayer system". Nature Materials, vol. 15, pp. 535-541, 2016.

Fukami, Shunsuke et al. "A spin-orbit torque switching scheme with collinear magnetic easy axis and current configuration". Nature Nanotechnology, vol. 11, pp. 1-5, 2016.

Takahashi, S. et al. "Spin injection and detection in magnetic nanostructures". Physical Review B 67, pp. 052409, 2003.

Seo, Yeongkyo et al. "Area-Efficient SOT-MRAM With a Schottky Diode". IEEE Electronic Device Letters, vol. 37, No. 8, pp. 982-985, 2016.

* cited by examiner

SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

BACKGROUND

The present disclosure relates to a spin-orbit-torque magnetization rotational element, a spin-orbit-torque magnetoresistance effect element, and a magnetic memory. Priority is claimed on Japanese Patent Application No. 2018-049767 filed in Japan on Mar. 16, 2018, the content of which is incorporated herein by reference.

DESCRIPTION OF RELATED ART

A giant magnetoresistance (GMR) element that is configured by a multilayer film including a ferromagnetic layer and a nonmagnetic layer and a tunneling magnetoresistance (TMR) element that uses an insulating layer (a tunnel barrier layer, a barrier layer) as a nonmagnetic layer is known as a magnetoresistance effect element. In general, a TMR element has a higher element resistance and a larger magnetoresistance (MR) ratio than a GMR element. For that reason, attention is being focused on a TMR element as an element for magnetic sensors, high frequency components, magnetic heads and nonvolatile random access memories (MRAM).

An MRAM reads and writes data by utilizing the characteristic that the element resistance of a TMR element changes as the direction of magnetization of two ferromagnetic layers sandwiching the insulating layer changes. As a writing method of an MRAM, a method in which writing (magnetization reversal) is performed by utilizing a magnetic field created by an electric current and a method in which writing (magnetization reversal) is performed by using a spin transfer torque (STT) generated by applying an electric current in a lamination direction of a magnetoresistance effect element are known.

Although the magnetization reversal of a TMR element using an STT is efficient from the viewpoint of energy efficiency, it is necessary to apply an electric current in the lamination direction of the magnetoresistance effect element when writing data. The writing current sometimes causes deterioration in characteristics of the magnetoresistance effect element.

Thus, in recent years, attention has been focused on magnetization reversal utilizing a spin-orbit-torque (SOT) resulting from a pure spin current generated by spin-orbit interaction, in which magnetization reversal is performed by a mechanism different from an STT (for example, PCT International Publication No. WO2008/123023). The SOT is induced by a pure spin current caused by a spin-orbit interaction or Rashba effect at an interface of dissimilar materials. An electric current for inducing the SOT in a magnetoresistance effect element flows in a direction intersecting a lamination direction of the magnetoresistance effect element. That is, it is unnecessary to flow an electric current in the lamination direction of the magnetoresistance effect element, such that a longer lifespan of the magnetoresistance effect element can be expected.

SUMMARY

In the magnetoresistance effect element using an SOT, a flow of an electric current when writing data differs from a flow of an electric current when reading data. When writing data, an electric current is caused to flow in a direction intersecting the lamination direction of the magnetoresistance effect element as described above. On the other hand, when reading data, an electric current is caused to flow in the lamination direction of the magnetoresistance effect element. In order to control both writing of data and reading of data, three terminals connected to the element are required, and a control element connected to each terminal is necessary. For the control element, for example, a field effect transistor (FET) or the like is used.

The magnetoresistance effect element is a recording region for recording data, and a plurality of the elements are often integrated and used during actual use. However, in the case of using a plurality of elements, if three control elements are connected to each element, the area required for one element is enlarged and it is difficult to enhance integration.

The present disclosure has been made in view of the above circumstances, and it is an object of the present disclosure to provide a spin-orbit-torque magnetization rotational element, a spin-orbit-torque magnetoresistance effect element and magnetic memory in which integration can be enhanced.

The present disclosure provides the following means to solve the above-mentioned problems.

(1) A spin-orbit-torque magnetization rotational element according to a first aspect of the present disclosure includes a spin-orbit-torque wiring extending in a first direction; a first ferromagnetic layer laminated on one surface of the spin-orbit-torque wiring; and a first electrode and a second electrode connected to the spin-orbit-torque wiring at positions sandwiching the first ferromagnetic layer in a plan view, wherein at least one of the first electrode and the second electrode includes therein a switching layer configured to shift between a high resistance state and a low resistance state with a predetermined threshold voltage as a boundary to allow an electric current to flow bidirectionally.

(2) In the spin-orbit-torque magnetization rotational element according to the above aspect, the first electrode and the second electrode may include the switching layer therein.

(3) In the spin-orbit-torque magnetization rotational element according to the above aspect, a threshold voltage of the switching layer of the first electrode may be different from a threshold voltage of the switching layer of the second electrode.

(4) In the spin-orbit-torque magnetization rotational element according to the above aspect, a relationship of $R_r + R_{on} > V_r/I_c$ may be satisfied, $R_r$ being a resistance value of the spin-orbit-torque wiring between: the first electrode or the second electrode energized in reading; and the first ferromagnetic layer, $R_{on}$ being a resistance value of the switching layer of the first electrode or the second electrode energized in reading in the low resistance state, $V_r$ being a voltage applied between: the first electrode or the second electrode energized in reading; and the first ferromagnetic layer, in reading, and $I_c$ being a critical threshold current required for a magnetization to be rotated in the first ferromagnetic layer.

(5) In the spin-orbit-torque magnetization rotational element according to the above aspect, the switching layer may be an alloy containing a chalcogen element.

(6) In the spin-orbit-torque magnetization rotational element according to the above aspect, the switching layer may be an oxide that contains a transition metal capable of undergoing a metal-insulator transition.

(7) A spin-orbit-torque magnetoresistance effect element according to a second aspect includes the spin-orbit-torque magnetization rotational element according to the above aspects, a second ferromagnetic layer facing the first ferromagnetic layer, and a nonmagnetic layer positioned between the first ferromagnetic layer and the second ferromagnetic layer.

(8) A magnetic memory according to a third aspect includes a plurality of the spin-orbit-torque magnetoresistance effect elements according to the above aspects.

According to the spin-orbit-torque magnetization rotational element and the spin-orbit-torque magnetoresistance effect element according to the above aspects, integration can be enhanced.

DETAILED DESCRIPTION

Figure 1:
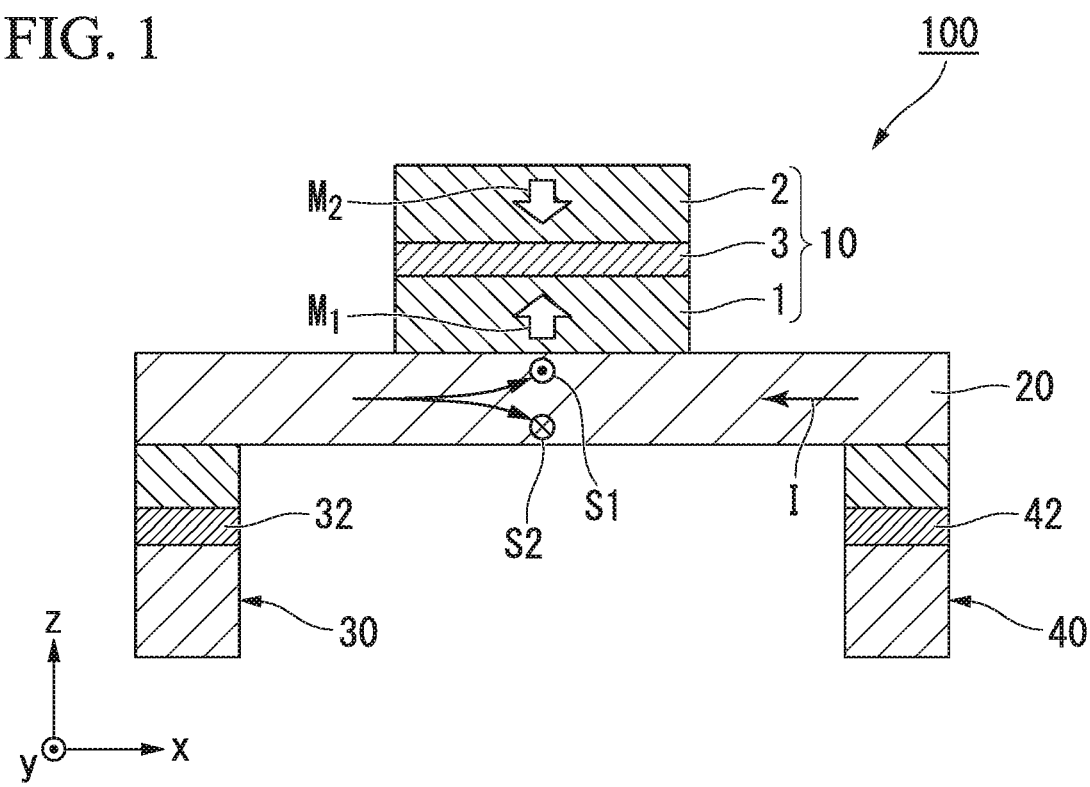
FIG. 1 is a schematic cross-sectional view of a spin-orbit-torque magnetoresistance effect element according to a first embodiment.

Hereinafter, the present embodiment will be described in detail with reference to the drawings as appropriate. In the drawings used in the following description, in order to make features easy to understand, characteristic portions may be illustrated in an enlarged manner for the sake of convenience, and dimensional ratios or the like between respective components may be different from actual ones. Materials, dimensions and the like exemplified in the following description are merely examples, and the present disclosure is not limited thereto and can be realized by being appropriately modified within a range in which the effects of the present disclosure are achieved.

First Embodiment (Spin-Orbit-Torque Magnetoresistance Effect Element)

FIG. 1 is a schematic cross-sectional view of a spin-orbit-torque magnetoresistance effect element 100 according to a first embodiment. The spin-orbit-torque magnetoresistance effect element 100 shown in FIG. 1 includes a functional part 10 including a first ferromagnetic layer 1, a second ferromagnetic layer 2, and a nonmagnetic layer 3, a spin-orbit-torque wiring 20, a first electrode 30, and a second electrode 40.

Hereinafter, a first direction in which the spin-orbit-torque wiring 20 extends is referred to as an x direction, a direction orthogonal to the x direction within a plane where the spin-orbit-torque wiring 20 is present is referred to as a y direction, and a direction orthogonal to both of the x direction and the y direction is referred to as a z direction. In FIG. 1, the z direction coincides with a lamination direction of the functional part 10 and a thickness direction of the spin-orbit-torque wiring 20.

<Functional Part>

The functional part 10 has the same configuration as a general magnetoresistance effect element. When the nonmagnetic layer 3 is made of an insulator, the functional part 10 has the same structure as a tunneling magnetoresistance (TMR) element, and when the nonmagnetic layer 3 is made of a metal, the functional part 10 has the same configuration as a giant magnetoresistance (GMR) element. The second ferromagnetic layer 2 is called a fixed layer or a reference layer, and the first ferromagnetic layer 1 is called a free layer, a memory layer, or the like.

The functional part 10 functions when a magnetization direction of the first ferromagnetic layer 1 is relatively changed with the magnetization of the second ferromagnetic layer 2 fixed in one direction (z direction). When the functional part 10 is applied to a coercivity-differed type (pseudo spin valve type) magnetoresistive random access memory (MRAM), the coercivity of the second ferromagnetic layer 2 is made to be larger than the coercivity of the first ferromagnetic layer 1. When the functional part 10 is applied to an exchange bias type (spin valve type) MRAM, the magnetization of the second ferromagnetic layer 2 is fixed by exchange coupling with an antiferromagnetic layer.

The functional part 10 may have layers other than the first ferromagnetic layer 1, the second ferromagnetic layer 2 and the nonmagnetic layer 3. For example, an antiferromagnetic layer for fixing the magnetization direction of the second ferromagnetic layer 2, an underlayer for improving crystallinity of the functional part 10, or the like can be exemplified.

For the first ferromagnetic layer 1 and the second ferromagnetic layer 2, a ferromagnetic material, particularly, a soft magnetic material, can be employed. For example, metals selected from the group consisting of Cr, Mn, Co, Fe and Ni, alloys containing at least one of the above metals, and alloys containing the above metals and at least one element from B, C, and N, or the like can be used. Specifically, Co—Fe, Co—Fe—B, and Ni—Fe can be exemplified. Also, when the first ferromagnetic layer 1 is an in-plane magnetized film, for example, a Co—Ho alloy ($CoHo_2$), an Sm—Fe alloy ($SmFe_{12}$) or the like may be used.

A Heusler alloy such as $Co_2FeSi$ may be used for the first ferromagnetic layer 1 and the second ferromagnetic layer 2. A Heusler alloy contains an intermetallic compound having a chemical composition of XYZ or $X_2YZ$, in which X is a transition metal element of the Co, Fe, Ni, or Cu groups or a noble metal element in the periodic table, Y is a transition metal of the Mn, V, Cr or Ti groups or the elements as for X, and Z is a typical element of Group III to Group V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like can be exemplified. Since a Heusler alloy has a high spin polarization, the MR ratio of the functional part can be increased.

For the nonmagnetic layer 3, a known material can be used.

For example, when the nonmagnetic layer 3 is made of an insulator (in the case of a tunnel barrier layer), $Al_2O_3$, $SiO_2$, MgO, $MgAl_2O_4$ and the like can be used as the material thereof. Further, in addition to these materials, a material in which a part of Al, Si, or Mg is substituted with Zn, Be and the like can also be used. Regarding these, since MgO and $MgAl_2O_4$ are materials that can realize coherent tunneling, spin can be efficiently injected. When the nonmagnetic layer 3 is made of a metal, Cu, Au, Ag and the like can be used as the material thereof. Also, when the nonmagnetic layer 3 is made of a semiconductor, Si, Ge, $CuInSe_2$, $CuGaSe_2$, $Cu(In, Ga)Se_2$ and the like can be used as the material thereof.

<Spin-Orbit-Torque Wiring>

The spin-orbit-torque wiring 20 extends in the x direction. The spin-orbit-torque wiring 20 is connected to one surface of the first ferromagnetic layer 1. The spin-orbit-torque wiring 20 may be directly connected to the first ferromagnetic layer 1 or may be connected via another layer.

The spin-orbit-torque wiring 20 generates a spin current by the spin Hall effect when an electric current flows. The spin Hall effect is a phenomenon in which, when an electric current is caused to flow in a material, a spin current is induced in a direction orthogonal to the direction of the electric current on the basis of a spin-orbit interaction. A mechanism by which the spin current is induced by the spin Hall effect will be described.

When a potential difference is applied to both ends of the spin-orbit-torque wiring 20, an electric current flows along the spin-orbit-torque wiring 20. When the electric current flows, a first spin S1 oriented in one direction and a second spin S2 oriented in a direction opposite thereto are respectively bent in directions orthogonal to the electric current. For example, the first spin S1 is bent in the z direction with respect to the traveling direction and the second spin S2 is bent in the −z direction with respect to the traveling direction.

The normal Hall effect and the spin Hall effect are the same in that a moving (flowing) direction of moving (flowing) electric charge (electrons) can be bent. On the other hand, they are greatly different in that, in the normal Hall effect, charged particles moving in a magnetic field are subjected to a Lorentz force so that their moving direction can be bent, whereas, in the spin Hall effect, a moving direction of a spin can be bent only by the movement of electrons (flowing of the electric current) even if there is no magnetic field.

Since the number of electrons of the first spin S1 is equal to the number of electrons of the second spin S2 in a nonmagnetic material (a material that is not a ferromagnetic material), the number of electrons of the first spin S1 oriented in the +z direction in the drawings is equal to the number of electrons of the second spin S2 oriented in the −z direction. In this case, the flows of charge cancel each other out, and the amount of the electric current becomes zero. The spin current which is not accompanied by an electric current is specifically called a pure spin current.

When the flow of electrons in the first spin S1 is defined as $J\uparrow$, the flow of electrons in the second spin S2 as $J\downarrow$, and the spin current as $J_S$, $J_S$ is defined by $J_S = J\uparrow - J\downarrow$. The spin current $J_S$ flows in the z direction in the drawings. In FIG. 1, there is the first ferromagnetic layer 1 on an upper surface of the spin-orbit-torque wiring 20. Therefore, spin is injected into the first ferromagnetic layer 1.

The spin-orbit-torque wiring 20 is configured by any one of a metal, an alloy, an intermetallic compound, a metal boride, a metal carbide, a metal silicide, and a metal phosphide which has a function of generating a spin current due to the spin Hall effect when an electric current flows.

The main constituent material of the spin-orbit-torque wiring 20 may be a nonmagnetic heavy metal. Here, a heavy metal means a metal having a specific gravity equal to or higher than that of yttrium. The nonmagnetic heavy metal may be a nonmagnetic metal having a large atomic number, that is, a nonmagnetic metal having an atomic number of 39 or more and having d electrons or f electrons in the outermost shell. In such a nonmagnetic metal, the spin-orbit interaction causing the spin Hall effect is large.

Electrons generally move in a direction opposite to an electric current regardless of the direction of spin thereof. In contrast to this, in a nonmagnetic metal having a large atomic number which has d electrons or f electrons in the outermost shell, the spin-orbit interaction becomes larger, and the spin Hall effect acts strongly. For that reason, a moving direction of electrons depends on the direction of spin of electrons. As a result, the spin current $J_S$ is easily generated in a nonmagnetic heavy metal.

In addition, the spin-orbit-torque wiring 20 may contain a magnetic metal. A magnetic metal means a ferromagnetic metal or an antiferromagnetic metal. If a small amount of magnetic metal is contained in the nonmagnetic metal, it becomes a cause of scattering spin. If the spin is scattered, the spin-orbit interaction is enhanced and the spin current generation efficiency with respect to the electric current is increased.

On the other hand, if an addition amount of the magnetic metal is excessively increased, the generated spin current is scattered by the added magnetic metal and, as a result, the action of decreasing the spin current becomes stronger in some cases. Therefore, a molar ratio of the added magnetic metal may be sufficiently smaller than a total molar ratio of elements constituting the spin-orbit-torque wiring. The molar ratio of the added magnetic metal may be 3% or less of this total.

The spin-orbit-torque wiring 20 may include a topological insulator. A topological insulator means a material in which the interior of the material is an insulator or a high resistance body, but a spin-polarized metallic state is generated on the surface thereof. In this material, an internal magnetic field is generated due to a spin-orbit interaction. As a result, even if there is no external magnetic field, a new topological phase develops due to the effect of the spin-orbit interaction. This is a topological insulator, and, due to a strong spin-orbit interaction and breaking of rotation symmetry at the edge, a pure spin current can be generated with high efficiency.

As the material of the topological insulator, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$ and the like may be used. These topological insulators are capable of generating a spin current with high efficiency.

<First Electrode and Second Electrode>

The first electrode 30 and the second electrode 40 are provided at positions sandwiching the functional part 10 in a plan view (viewed from the z direction). The first electrode 30 and the second electrode 40 may be provided on the functional part 10 side of the spin-orbit-torque wiring 20, or may be provided on the side opposite thereto. The element is driven by three terminals, an upper electrode (not shown) connected to the side opposite to the spin-orbit-torque wiring 20 of the functional part 10, and the first electrode 30 and the second electrode 40. When data is written, an electric current is caused to flow between the first electrode 30 and the second electrode 40, and when data is read out, an electric current is caused to flow between the upper electrode (not shown) and the first electrode 30 or the second electrode 40.

The first electrode 30 shown in FIG. 1 has a first switching layer 32 therein and the second electrode 40 has a second switching layer 42 therein. The first switching layer 32 and the second switching layer 42 are layers that change to a high resistance state and to a low resistance state with a predetermined threshold voltage as a boundary.

When data is written, a potential difference is applied between the first electrode 30 and the second electrode 40. When the potential difference exceeds a predetermined threshold value, the first switching layer 32 and the second switching layer 42 are in a low resistance state. When the first switching layer 32 and the second switching layer 42 are in the low resistance state, an electric current flows in the spin-orbit-torque wiring 20, and the magnetization $M_1$ of the first ferromagnetic layer 1 is reversed (data is written).

When data is read out, a potential difference is applied between the upper electrode and the first electrode 30 or the second electrode 40. When the potential difference exceeds a predetermined threshold value, the first switching layer 32 or the second switching layer 42 positioned on the side to which the potential difference is applied is in a low resistance state. When the first switching layer 32 or the second switching layer 42 is in the low resistance state, an electric current flows in the lamination direction of the functional part 10, and the magnitude of the resistance value of the functional part 10 is read out as information (data is read).

In this manner, the first switching layer 32 and the second switching layer 42 control the flow of the electric current. That is, when the first switching layer 32 and the second switching layer 42 are respectively built into the first electrode 30 and the second electrode 40, it is not necessary to connect a control element to the outside of the first electrode 30 and the second electrode 40. It is thus possible to effectively utilize the space provided for the control element and to improve the integration.

The threshold voltage of the first switching layer 32 and the threshold voltage of the second switching layer 42 are different from each other. For example, the threshold voltage of the first switching layer 32 is a first threshold voltage, and the threshold voltage of the second switching layer 42 is a second threshold voltage. Further, the first threshold voltage may be larger than the second threshold voltage.

In this case, when a voltage exceeding the first threshold voltage is applied between the first electrode 30 and the second electrode 40, an electric current flows in the spin-orbit-torque wiring 20 (data is written). On the other hand, when a voltage exceeding the second threshold voltage is applied between the upper electrode and the second electrode 40, an electric current flows in the lamination direction of the functional part 10 (data is read). That is, if the threshold voltage of the first switching layer 32 is different from the threshold voltage of the second switching layer 42, the voltage applied to the element can be changed between when writing data and when reading data.

A current density required for writing data is different from a current density required for reading data. The current density required for reading data is small as compared with the current density required for writing data. When data is read out, it is necessary to flow an electric current in the lamination direction of the functional part 10, which may degrade the characteristics of the functional part 10. If the threshold voltage when reading data is smaller than that when writing data, the load applied to the functional part 10 can be reduced.

The first switching layer 32 and the second switching layer 42 are layers which can be changed into the high resistance state and the low resistance state with a threshold voltage as a boundary to allow an electric current to flow bidirectionally. For the first switching layer 32 and the second switching layer 42, for example, layers utilizing a phase change of a crystal layer such as an ovonic threshold switch (OTS), layers utilizing a change in the band structure such as a metal-insulator transition switch, layers utilizing a breakdown voltage such as a Zener diode and an avalanche diode, and layers whose conductivity changes with the change in atomic position, or the like can be used. On the other hand, since the direction of the electric current flowing through the spin-orbit-torque wiring 20 changes when rewriting data, an element for rectifying only in one direction such as a PN diode cannot be used.

As a specific example for the first switching layer 32 and the second switching layer 42, an alloy containing a chalcogen element can be used. The chalcogen element is an element of group 16 in the periodic table, and, specifically, there are oxygen (O), sulfur (S), selenium (Se), tellurium (Te), polonium (Po) and livermorium (Lv).

In addition to the chalcogen element, the alloy containing the chalcogen element may contain, for example, germanium (Ge), antimony (Sb), silicon (Si), arsenic (As), or the like. It may be composed of a chalcogenide such as GeTe, GeSbTe, $Ge_2Sb_2Te_5$, SiAsTe, GeSiAsTe, GeSiAsSe, GeSe, GeSbSe, SiAsSe, $As_2Se_3$, GeS, GeSbS or SiAsS. Also, Oxygen (O) and nitrogen (N) may also be added to these. For example, there is $SiO_2As$.

The alloy containing the chalcogen element may contain metal elements such as aluminum (Al), magnesium (Mg), boron (B), yttrium (Y) and rare earth element as additional elements other than the above elements.

The alloy containing the chalcogen element undergoes a phase change from an amorphous phase (more resistive) to a crystalline phase (more conductive) or vice versa according to ambient temperature. When the alloy containing the chalcogen element is used for the first switching layer 32 and the second switching layer 42, heat is generated by applying a voltage, and a phase change occurs. In the alloy containing the chalcogen element, the magnitude of the resistivity varies with a magnitude of 2 digits or more due to the phase change.

The threshold voltage can be changed by changing a type of an element, quantity of an element, a thickness or the like constituting the alloy containing the chalcogen element.

As another specific example for the first switching layer 32 and the second switching layer 42, oxides that contain a transition metal capable of undergoing a metal-insulator transition can be used. Examples of the oxides that contain the transition metal capable of undergoing the metal-insulator transition include Mott insulators, Anderson transitions, and the like. Specifically, as the Mott insulators, NiO, $SmNiO_3$, $VO_2$, $WO_3$, $TiO_2$, $SrTiO_3$, $NbO_2$, $PrCaMnO_3$, $CaRuO_4$ or the like can be used, and as the Anderson transitions, $NaWTaO_3$, $LaSrO_3$ or the like can be used.

Band structures of the oxides containing the transition metal change depending on ambient temperature. In the case where the oxides containing the transition metal are used for the first switching layer 32 and the second switching layer 42, heat is generated by applying a voltage, and metal-insulator transition occurs.

The oxides containing the transition metal can change a threshold voltage by changing a type of a constituent element, quantity of an element, a thickness or the like.

The first switching layer 32 and the second switching layer 42 may have the same configuration as described above or may have different configurations.

Figure 2:
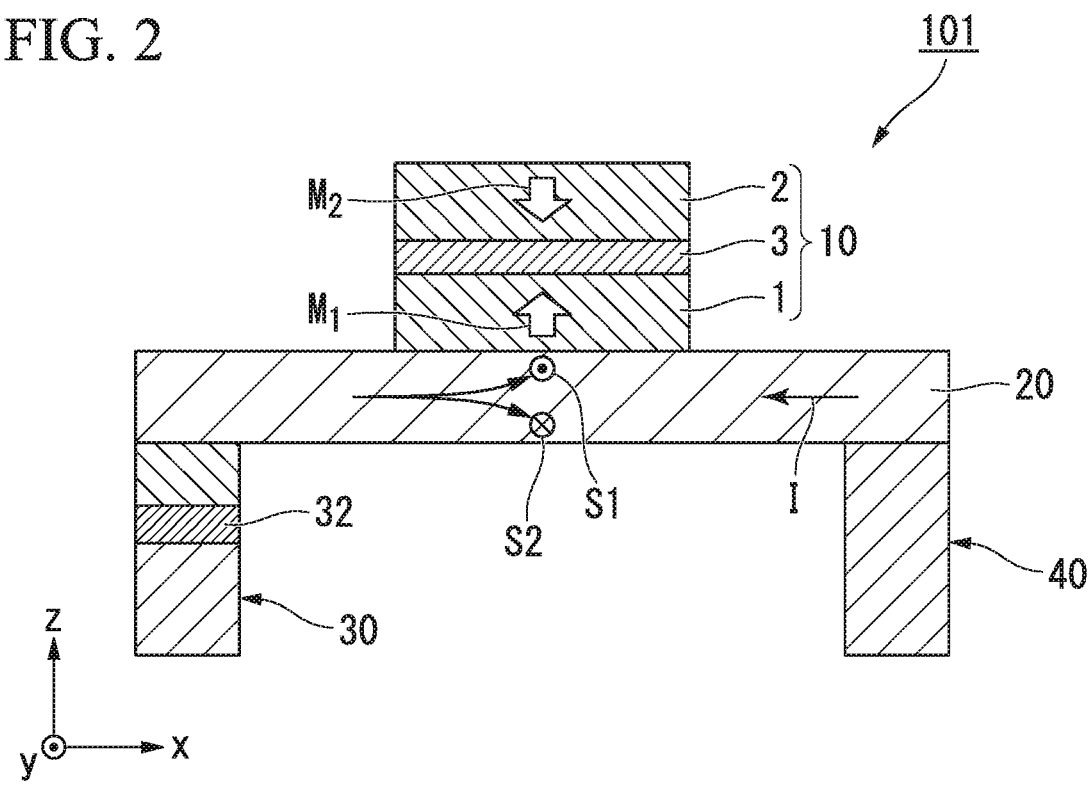
FIG. 2 is a schematic cross-sectional view of another example of the spin-orbit-torque magnetoresistance effect element according to the first embodiment.

In addition, as in the spin-orbit-torque magnetoresistance effect element 101 shown in FIG. 2, the switching layer may be provided only in either one of the first electrode 30 and the second electrode 40. In the spin-orbit-torque magnetoresistance effect element 101 shown in FIG. 2, the first switching layer 32 is provided only in the first electrode 30, and the switching layer is not provided in the second electrode 40. Also in this case, it is unnecessary to connect at least a control element for controlling writing, and the integration of the element can be enhanced.

Portions of the first electrode 30 and the second electrode 40 other than the first switching layer 32 and the second switching layer 42 may include any of a group consisting of Ag, Au, Cu, Al, W, Co, Ni, Zn, Ta, TiN and TaN. These materials are excellent in thermal conductivity and can efficiently dissipate heat accumulated in the spin-orbit-torque wiring 20.

As described above, when at least one of the first electrode 30 and the second electrode 40 has therein the switching layer which is changed into the high resistance state and the low resistance state with a predetermined threshold voltage as a boundary, it is possible to reduce the number of control elements which are connected to the outside of the spin-orbit-torque magnetoresistance effect elements 100 and 101 and controls the operation. The space provided for the control element can be effectively utilized so that the integration can be enhanced.

Also, when the switching layer exceeds the threshold voltage, a resistance value greatly changes from the high resistance state to the low resistance state. When the switching layer is in the low resistance state, the electric current rapidly flows. In the case of the STT type magnetoresistance effect element in which a flowing direction of the electric current when writing coincides with the lamination direction of the functional part, this change in the amount of the electric current imposes a large load on the functional part. On the other hand, in the case of the spin-orbit-torque magnetoresistance effect element 100, when the switching layer is in the low resistance state at the time of writing, a direction in which a large electric current flows is a direction crossing the lamination direction of the functional part 10 (a direction along the spin-orbit-torque wiring 20). Therefore, a resistance value change amount between the high resistance state and the low resistance state of the switching layer can be set to a large amount without considering an influence on the functional part 10. Also, as described above, since the amount of the electric current required when reading is smaller than that required when writing, the influence imposed thereon is small even if the flowing direction of the electric current and the lamination direction of the functional part 10 coincide with each other.

(Operations of Spin-Orbit-Torque Magnetoresistance Effect Element)

Figure 3:
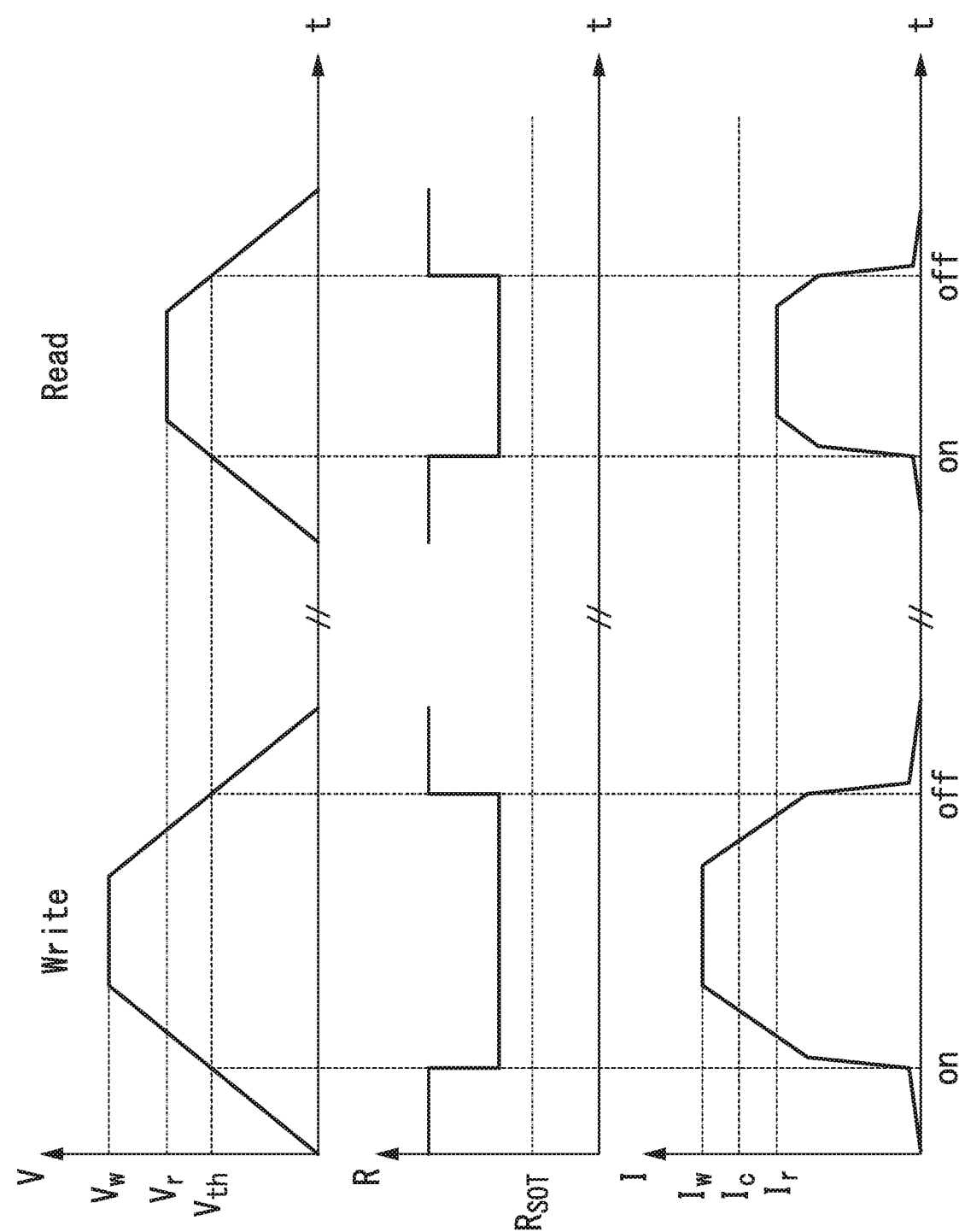
FIG. 3 is a timing chart at the time of operation of the spin-orbit-torque magnetoresistance effect element according to the first embodiment.

Operations of the spin-orbit-torque magnetoresistance effect element has been briefly described in the above, and the details will be described. FIG. 3 is a timing chart at the time of operating the spin-orbit-torque magnetoresistance effect element according to the first embodiment. The left side of FIG. 3 shows voltages, resistances and current changes of the spin-orbit-torque magnetoresistance effect element when writing, and the right side of FIG. 3 shows voltages, resistances, current changes of the spin-orbit-torque magnetoresistance effect element when reading.

As described above, the spin-orbit-torque magnetoresistance effect element behaves differently when writing and reading data. First, the spin-orbit-torque magnetoresistance effect element 100 shown in FIG. 1 when writing data will be described as an example.

First, when writing data, a voltage is applied between the first electrode 30 and the second electrode 40. When the applied voltage exceeds a threshold voltage $V_{th}$ of the first switching layer 32 and the second switching layer 42, an electric current flows through the spin-orbit-torque wiring 20. When a first threshold voltage $V_{th1}$ of the first switching layer 32 is different from a second threshold voltage $V_{th2}$ of the second switching layer 42, an electric current flows through the spin-orbit-torque wiring 20 when the voltage exceeds the higher threshold voltage. In the following description, the first switching layer 32 and the second switching element 42 will be described as being equal for simplicity.

When the threshold voltage $V_{th}$ is exceeded, the resistance value between the first electrode 30 and the second electrode 40 becomes from $R_{SOT}+2R_{off}$ to $R_{SOT}+2R_{on}$. $R_{SOT}$ is a resistance value of the spin-orbit-torque wiring 20, $R_{on}$ is a resistance value of each of the first switching element 32 and the second switching element 42 in the low resistance state, and $R_{off}$ is a resistance value of each of the first switching element 32 and the second switching element 42 in the high resistance state. The resistance value between the first electrode 30 and the second electrode 40 does not fluctuate greatly as long as the first switching element 32 and the second switching element 42 are in the low resistance state.

When the voltage applied between the first electrode 30 and the second electrode 40 further increases from the threshold voltage $V_{th}$, the amount of the electric current flowing through the spin-orbit-torque wiring 20 increases. When a writing current $I_w$ flowing through the spin-orbit-torque wiring 20 exceeds a critical threshold current $I_c$ required to perform magnetization reversal of the first ferromagnetic layer 1, the magnetization of the first ferromagnetic layer 1 is reversed.

In other words, by applying a writing voltage $V_w$ at which the writing current $I_w$ becomes larger than the critical threshold current $I_c$, data writing processing is performed. The writing voltage $V_w$ is larger than the threshold voltage $V_{th}$.

On the other hand, when reading data, first, a voltage is applied between the first electrode 30 or the second electrode 40 and the upper electrode (not shown) provided on an upper portion of the functional part 10. Hereinafter, a case where a voltage is applied between the first electrode 30 and the upper electrode will be described as an example.

When the applied voltage exceeds the threshold voltage $V_{th}$ of the first switching layer 32, an electric current flows between the first electrode 30 and the upper electrode. When the threshold voltage $V_{th}$ is exceeded, the resistance value between the first electrode 30 and the second electrode 40 becomes $R_{SOT}+2R_{on}$ similarly to the case when writing. On the other hand, the electric current flowing when reading is between the first electrode 30 and the upper electrode, and the resistance value therebetween is $R_r+R_{on}$. $R_r$ is a resistance value of the spin-orbit-torque wiring 20 between the first electrode 30 or the second electrode 40 which is energized when reading and the first ferromagnetic layer 1, and, in this case, corresponds to a resistance value of the spin-orbit-torque wiring 20 between the first electrode and the first ferromagnetic layer 1. The resistance value between the first electrode 30 and the upper electrode does not fluctuate greatly as long as the first switching element 32 is in the low resistance state.

When the voltage applied between the first electrode 30 and the upper electrode further increases from the threshold voltage $V_{th}$, the amount of the electric current flowing between the first electrode 30 and the upper electrode increases. Data is read out when the amount of the electric current flowing between the first electrode 30 and the upper electrode exceeds a reading current $I_r$.

The reading current $I_r$ may be smaller than the critical threshold current $I_c$ as shown in FIG. 3. Some of the reading current $I_r$ flows along the spin-orbit-torque wiring 20. The electric current flowing along the spin-orbit-torque wiring 20 creates a spin current due to the spin Hall effect. If the reading current $I_r$ is larger than the critical threshold current $I_c$, it causes an erroneous writing at the time of reading.

When the voltage applied between the first electrode 30 and the upper electrode to cause the reading current $I_r$ to flow is a writing voltage $V_r$, the relationship of $V_r=I_r(R_r+R_{on})$ is established. In order to satisfy the relationship $I_r<I_c$, the resistance values of the spin-orbit-torque wiring 20 and the first switching element 32 may satisfy the relationship of $R_r+R_{on}>V_r/I_c$. The first ferromagnetic layer 1 is often positioned at a center in a longitudinal direction of the spin-orbit-torque wiring 20, so that the above expression can be rewritten as $R_{SOT}/2+R_{on}>V_r/I_c$.

The spin-orbit-torque magnetoresistance effect element also satisfies the relationship $I_c<I_w$. The relationship of $V_w=I_w(R_{SOT}+2R_{on})$ is established between the writing current $I_w$ and the writing voltage $V_w$. In order to satisfy the relationship $I_c<I_w$, the resistance values of the spin-orbit-torque wiring 20 and the first switching element may satisfy the relationship of $R_{SOT}+2R_{on}<V_w/I_c$. The resistance values of the spin-orbit-torque wiring 20 and the switching elements (the first switching element 32 and the second switching element 42) may be determined to satisfy the relationship of $V_r/I_c<R_{SOT}/2+R_{on}<V_w/I_c$, as combinedly described with the relational expression of reading.

Second Embodiment (Spin-Orbit-Torque Magnetization Rotational Element)

Figure 4:
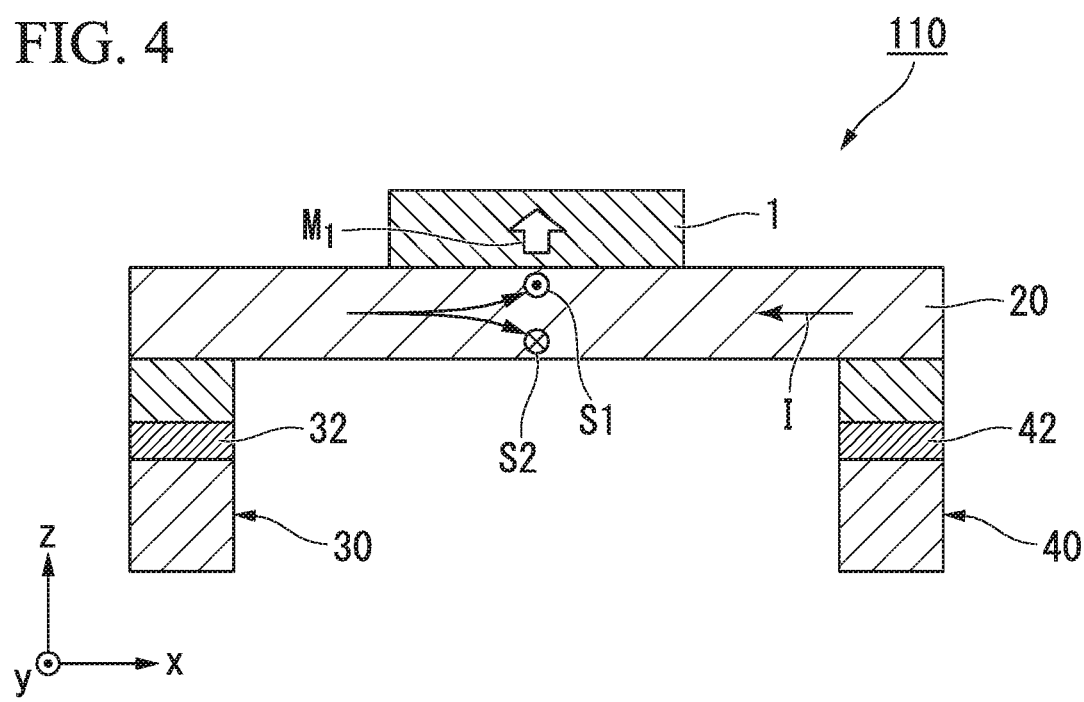
FIG. 4 is a schematic cross-sectional view of a spin-orbit-torque magnetization rotational element according to a second embodiment.

FIG. 4 is a schematic cross-sectional view of a spin-orbit-torque magnetization rotational element according to this embodiment. The spin-orbit-torque magnetization rotational element 110 shown in FIG. 4 differs from the spin-orbit-torque magnetoresistance effect element 100 shown in FIG. 1 only in that it does not have the nonmagnetic layer 3 and the second ferromagnetic layer 2.

The spin-orbit-torque magnetization rotational element 110 can be used as a magnetoresistance effect element as described above. In addition, the spin-orbit-torque magnetization rotational element 110 can be utilized alone as anisotropic magnetic sensors or optical elements utilizing a magnetic Kerr effect or a magnetic Faraday effect. When the magnetization is reversed, a spin current magnetization rotational element can be particularly called a spin current magnetization reversal element.

In the spin-orbit-torque magnetization rotational element according to the present embodiment, at least one of the first electrode 30 and the second electrode 40 has therein the switching layer which is changed into the high resistance state and the low resistance state with a predetermined threshold voltage as a boundary. Therefore, it is possible to reduce the number of control elements which are connected to the outside of the spin-orbit-torque magnetization rotational element 110 and control the operation. The space provided for the control element can be effectively utilized and the integration can be enhanced.

Third Embodiment

<Magnetic Memory>

Figure 5:
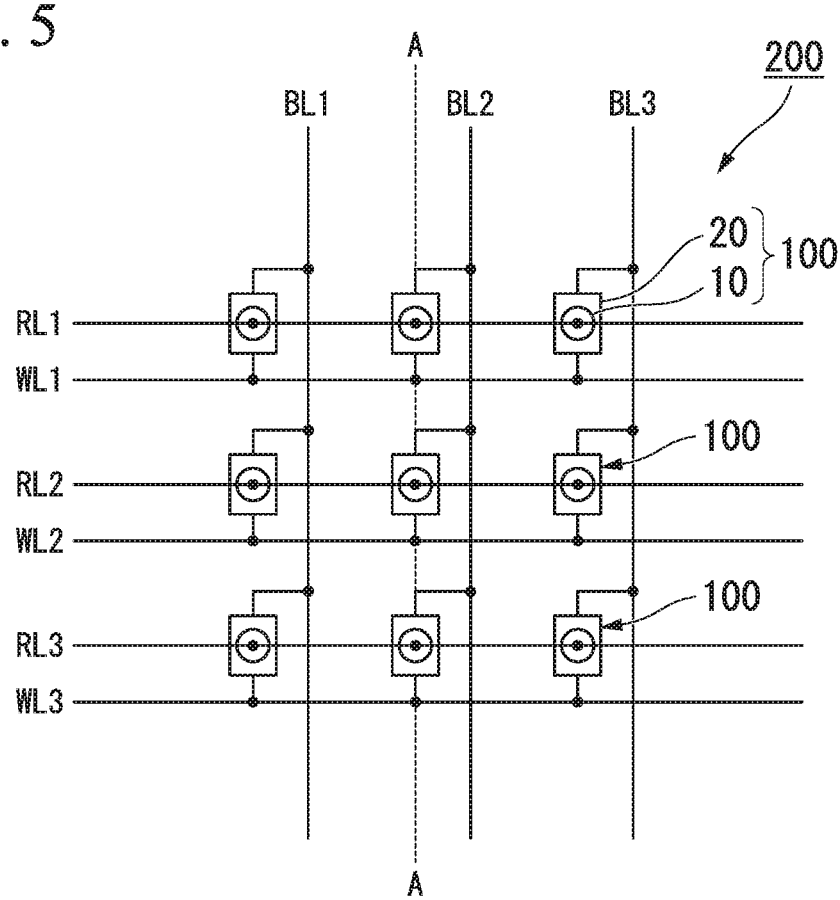
FIG. 5 is a diagram schematically showing a magnetic memory according to a third embodiment.

FIG. 5 is a schematic diagram of a magnetic memory 200 including a plurality of spin-orbit-torque magnetoresistance effect elements 100 (see FIG. 1). FIG. 1 corresponds to a cross-sectional view of the spin-orbit-torque magnetoresistance effect element 100 taken along the A-A plane in FIG. 5. In the magnetic memory 200 shown in FIG. 5, the spin-orbit-torque magnetoresistance effect element 100 is arranged in a 3×3 matrix. FIG. 5 is an example of a magnetic memory, and the configuration, number and arrangement of the spin-orbit-torque magnetoresistance effect elements 100 are arbitrary.

One word line WL1 to WL3, one bit line BL1 to BL3, and one read line RL1 to RL3 are each connected to the spin-orbit-torque magnetoresistance effect element 100.

By applying a voltage difference equal to or larger than a predetermined value between the word lines WL1 to WL3 and the bit lines BL1 to BL3, an electric current flows in the spin-orbit-torque wiring 20 of an arbitrary spin-orbit-torque magnetoresistance effect element 100 to perform a writing operation. By applying a voltage difference equal to or larger than a predetermined value between the read lines RL1 to RL3 and the bit lines BL1 to BL3, an electric current flows in the lamination direction of the functional part 10 of an arbitrary spin-orbit-torque magnetoresistance effect element 100 to perform a reading operation. By reading out data of an arbitrary element from these plurality of spin-orbit-torque magnetoresistance effect elements 100, the magnetic memory 200 can be utilized as a magnetic memory.

In addition, in the magnetic memory 200 according to the present embodiment, it is possible to select an element to which data is written or an element from which data is read by only controlling the voltage to be applied. Therefore, it is possible to integrate the spin-orbit-torque magnetoresistance effect elements 100 with high density, and it is possible to realize the magnetic memory excellent in integration.

Although preferred embodiments of the present disclosure have been described above in detail, it should be appreciated that the present disclosure is not limited to specific embodiments, and various modifications and changes are possible within the scope of the gist of the present disclosure described in the claims.

EXPLANATION OF REFERENCES

1: First ferromagnetic layer
2: Second ferromagnetic layer
3: Nonmagnetic layer
10: Functional part
20: Spin-orbit-torque wiring
30: First electrode
32: First switching layer
40: Second electrode
42: Second switching layer
100, 101: Spin-orbit-torque magnetoresistance effect element
110: Spin-orbit-torque magnetization rotational element
200: Magnetic memory
$M_1$, $M_2$: Magnetization

What is claimed is:

1. A spin-orbit-torque magnetization rotational element comprising:
   a spin-orbit-torque wiring extending in a first direction;
   a first ferromagnetic layer laminated on one surface of the spin-orbit-torque wiring in a second direction that crosses the first direction; and
   a first electrode and a second electrode connected to the spin-orbit-torque wiring at positions sandwiching the first ferromagnetic layer in a plan view in the second direction, wherein:
   at least one of the first electrode and the second electrode includes a switching layer configured to shift between a high resistance state and a low resistance state with a predetermined threshold voltage as a boundary to allow an electric current to flow bidirectionally;

the switching layer is arranged to cross the second direction;

relationships of (i) and (ii) are satisfied:

$$Vr/Ic < Rr + R_{ON} \quad \text{(i)}$$

$$R_{SOT} + 2R_{ON} < Vw/Ic \quad \text{(ii)}$$

$R_r$ being a resistance value of the spin-orbit-torque wiring between the first electrode or the second electrode energized in reading and the first ferromagnetic layer, $R_{on}$ being a resistance value of the switching layer of the first electrode or the second electrode energized in reading in the low resistance state, $R_{SOT}$ being a resistance value of the spin-orbit-torque wiring, $V_w$ being a voltage applied between the first electrode energized in writing and the second electrode in writing, $V_r$ being a voltage applied between the first electrode or the second electrode energized in reading; and the first ferromagnetic layer in reading, and $I_c$ being a critical threshold current required for a magnetization to be rotated in the first ferromagnetic layer; and the switching layer is an alloy containing a chalcogen element and an additional element selected from the group consisting of aluminum, magnesium, boron, yttrium and rare earth element.

2. The spin-orbit-torque magnetization rotational element according to claim 1, wherein the first electrode and the second electrode include the switching layer therein.

3. The spin-orbit-torque magnetization rotational element according to claim 2, wherein a threshold voltage of the switching layer of the first electrode is different from a threshold voltage of the switching layer of the second electrode.

4. The spin-orbit-torque magnetization rotational element according to claim 1, wherein the switching layer is an oxide that contains a transition metal capable of undergoing a metal-insulator transition.

5. The spin-orbit-torque magnetization rotational element according to claim 2, wherein the switching layer is an oxide that contains a transition metal capable of undergoing a metal-insulator transition.

6. The spin-orbit-torque magnetization rotational element according to claim 3, wherein the switching layer is an oxide that contains a transition metal capable of undergoing a metal-insulator transition.

7. A spin-orbit-torque magnetoresistance effect element comprising:
the spin-orbit-torque magnetization rotational element according to claim 1;
a second ferromagnetic layer facing the first ferromagnetic layer; and
a nonmagnetic layer positioned between the first ferromagnetic layer and the second ferromagnetic layer.

8. A magnetic memory comprising a plurality of the spin-orbit-torque magnetoresistance effect elements according to claim 7.

* * * * *